United States Patent [19]

Takahashi

[11] Patent Number: 4,486,364
[45] Date of Patent: Dec. 4, 1984

[54] METHOD AND APPARATUS FOR MOLDING A SYNTHETIC RESIN LENS FOR A LIGHT EMITTING DIODE

[75] Inventor: Kaoru Takahashi, Zama, Japan

[73] Assignee: Stanley Electric Company, Ltd., Tokyo, Japan

[21] Appl. No.: 393,466

[22] Filed: Jun. 29, 1982

[30] Foreign Application Priority Data

Dec. 4, 1981 [JP] Japan .................. 56-195265

[51] Int. Cl.³ .............................. B29D 11/00
[52] U.S. Cl. ....................... 264/1.7; 249/85; 249/96; 264/272.16; 264/272.17; 264/275; 425/121; 425/808
[58] Field of Search .............. 264/272.15, 272.16, 264/272.17, 1.5, 1.7, 275; 357/72; 29/569 L, 588; 425/808, 121; 249/85, 96

[56] References Cited

U.S. PATENT DOCUMENTS

| | | | |
|---|---|---|---|
| 3,484,536 | 12/1969 | Jaeschke et al. | 357/72 |
| 3,805,347 | 4/1974 | Collins et al. | 357/72 |
| 3,806,766 | 4/1974 | Fanning | 357/72 |
| 3,855,606 | 12/1974 | Schoberl | 357/72 |
| 4,152,624 | 5/1979 | Knaebel | 357/72 |
| 4,188,708 | 2/1980 | Frederiksen | 264/272.17 |

FOREIGN PATENT DOCUMENTS

| | | | |
|---|---|---|---|
| 2509047 | 9/1976 | Fed. Rep. of Germany | 357/72 |
| 135425 | 5/1979 | Fed. Rep. of Germany | 357/72 |
| 53-142176 | 12/1978 | Japan | 29/588 |
| 54-69063 | 6/1979 | Japan | 29/569 L |

*Primary Examiner*—James Lowe
*Attorney, Agent, or Firm*—Louis Weinstein

[57] ABSTRACT

A lens for a light emitting diode is formed by inserting a pair of lead frames into a mold having grooves for snugly receiving the outer free ends of the lead frames. The outer-most edge of the lead frame free ends engage the base of the mold, thereby precisely locating the light emitting element, mounted on the lead frames, relative to the top surface of the lens. The snug fit for the outer free ends assures that the outer free ends are free of the resin to facilitate alignment of the finished product in an electro-optical circuit and to provide improved radiation of heat to the atmosphere.

5 Claims, 9 Drawing Figures

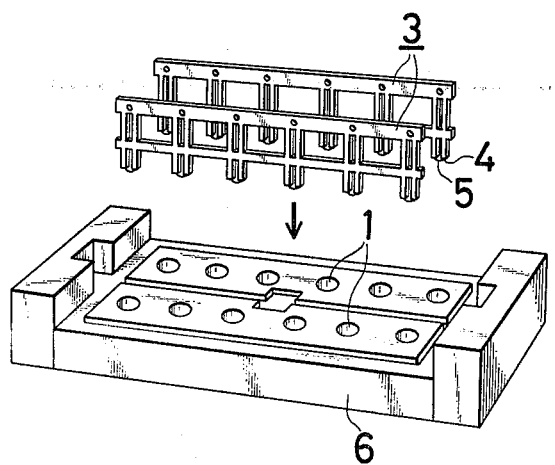
Fig. 7
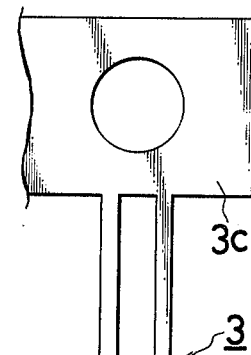
Fig. 8
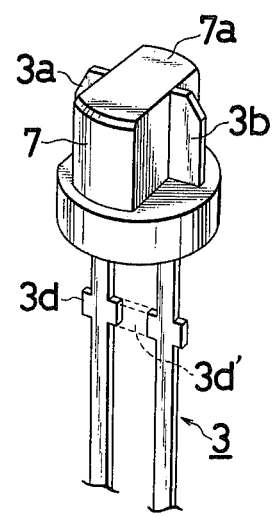
Fig. 9
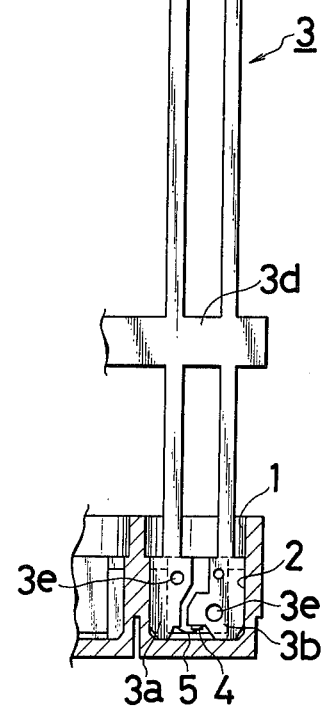

METHOD AND APPARATUS FOR MOLDING A SYNTHETIC RESIN LENS FOR A LIGHT EMITTING DIODE

BACKGROUND OF THE INVENTION

This invention relates to a method and apparatus for molding a synthetic resin lens for a light emitting diode.

Generally, a synthetic resin lens is molded on the end of a light emitting diode containing the light emitting element. In molding such a synthetic resin lens, a mold has heretofore been used to achieve molding whereby the free ends of lead frames are inserted into said molds and the molds are filled with synthetic resin, and a light emitting diode attached to the free end of the lead frame, together with the free end of the lead frame is inserted into the mold. In such conventional apparatus, however, no means is provided for accurately positioning the lead frame in the mold when the lead frame is inserted into the mold and, therefore, this poses disadvantages in that the position of the lead frame may be displaced from the desired position resulting in non-uniform products and further in that the light emitting diode is deviated from a reference position rendering the resulting products unacceptable.

The present invention eliminates these disadvantages noted above with respect to prior art techniques and principally provides a method and apparatus for molding a synthetic resin lens for a light emitting diode, in which a lens may be molded while positively maintaining a proper position and alignment of the lead frames relative to the lens being molded thereon.

BRIEF DESCRIPTION OF THE FIGURES

The drawings show one embodiment of the present invention, in which:

FIG. 7 is a perspective view showing the manner in which lead frames are inserted into molds of the type shown in FIG. 1;

FIG. 8 is a sectional view showing the manner in which the free ends of the lead frames are fitted into the grooves of the mold; and;

FIG. 9 is a perspective view showing a light emitting diode having a lens which has been molded in accordance with the method and apparatus of the present invention.

DETAILED DESCRIPTION OF THE INVENTION

Figure 1:
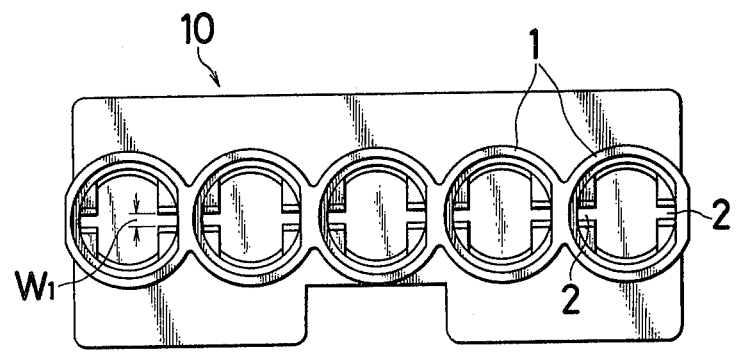
FIG. 1 is a plan view of a mold for molding a synthetic resin lens.
Figure 2:
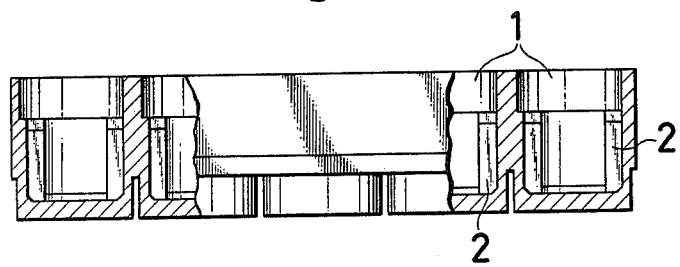
FIG. 2 is a partly cutaway front view of the mold of FIG. 1.
Figure 3:
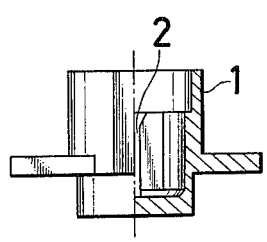
FIG. 3 is a semi-sectional view of the mold of FIG. 1 as viewed from the side.
Figure 4:
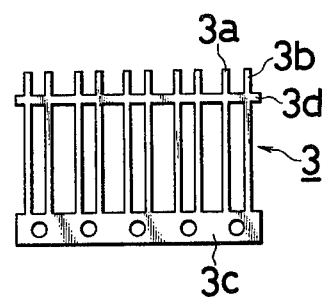
FIG. 4 is a simplified plan view of an array of lead frames arranged in a line.
Figure 5:
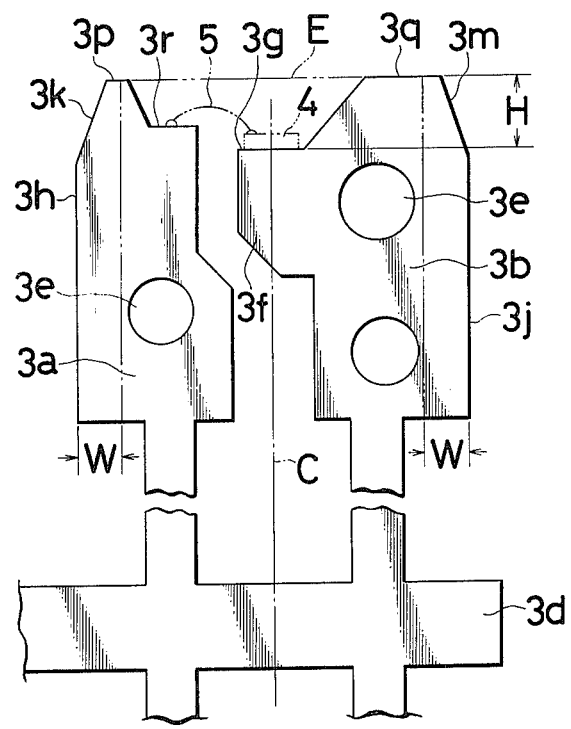
FIG. 5 is an enlarged view of the free ends of a pair of lead frames.
Figure 6:
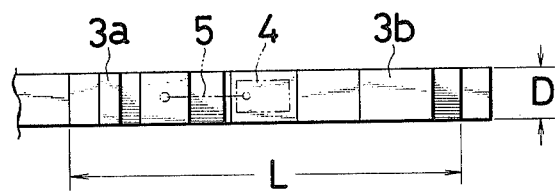
FIG. 6 is a plan view of the lead frames shown in FIG. 5.

The method in accordance with the present invention will now be described in detail by way of an embodiment shown in the drawing. In FIGS. 1-3, the reference numeral 1 designates a plurality of molds disposed side by side within a body 10, inner peripheral surfaces of the molds being finished to have a mirror-like surface, each mold having a pair of grooves 2 communicating with the mold 1 and aligned along an imaginary diameter and provided in an inner wall thereof. The reference numeral 3 designates a lead frame, shown in FIG. 4. A pair of adjacent lead frames 3a and 3b as a unit are arranged in spaced parallel fashion, and a holder plate 3c is integrally joined to the lead frames 3a, 3b at one end thereof. A reinforcing strip 3d is integrally joined to the lead frames on a portion of each lead frame near the other free end which is the top end as shown in FIG. 4. At the free end of the lead frame 3, as shown in FIG. 5, a light emitting element (a light emitting diode tip) 4 is mounted on the upper end 3g of a portion 3f of the lead frame projecting to one side of the lead frame 3b, said light emitting element 4 having one end of a wire 5 bonded thereto. The other end of wire 5 is bonded to surface 3r. The light emitting element 4 is positioned so that an imaginary line C which is parallel and aligned equidistant to the lead frames 3a and 3b passes through the center of light emitting element 4. The lead frames 3a, 3b are of a thickness D which is substantially equal to the width $W_1$ of the grooves 2 of each mold 1 (see FIG. 1). The distance L between outer edges 3h, 3j of the lead frames 3a, 3b is substantially adjusted to coincide with an inside diameter of the mold 1 extending between the recesses 2, 2 and the distance H from the free end of the lead frame 3 to the mounting surface 3g for the light emitting diode 4 is predetermined to have a fixed dimension. 3e is a hold bored in each lead frame to strengthen the bond between the lead frames and the synthetic resin to be poured into the mold.

Thus, in the lead frame assembly 3 formed to provide an array of lead frame pairs 3a, 3b, each pair of lead frames 3a and 3b is respectively directed toward the molds 1, with their free ends directed downwardly, to be fitted into the grooves 2 in the molds 1 mounted on a stationary jig 6, as shown in FIG. 7. The tapered portions 3k, 3m facilitate the guidance and insertion of the lead frames 3a, 3b into the mold 1. A thermosetting resin is poured into each mold 1 to mold a lens 7 of a shape conforming to mold 1. At this time, as shown in FIG. 8, the outer edges 3h, 3j of the lead frames 3a and 3b are substantially snugly fitted within the grooves 2 of the molds 1, and therefore, the synthetic resin rarely flows into grooves 2 with the result that the outer ends of the lead frames 3a and 3b having a width W corresponding to the depth of the grooves 2 are respectively projected externally of the molded lens 7 and are substantially free of any synthetic resin, as shown in FIG. 9. Also, the free ends of the lead frames 3a and 3b come into contact with the bottom surface of the mold 1, said bottom surface engaging a free end edge E of the molded lens 7 (see FIG. 5) and thus, the distance from the foremost end edge E to the surface 3g upon which the light emitting element 4 is mounted, is equal to the distance H from the foremost end of the lead frame 3, which is the same value for all of the molds 1. In addition, the free edges 3p, 3q lie in a common imaginary plane to assure that these edges engage the flat base of the mold 1. Accordingly, the light emitting element 4 within the molded lens 7 assumes a fixed position, whereby there occurs no unevenness, and said position is controlled by said distance H to make it possible to easily set the desired position of the light emitting element 4 relative to the top surface 7a of lens 7.

As described hereinbefore, according to the method of the present invention, the light emitting element mounted on the lead frames 3a, 3b may be held at a proper position when molding a synthetic resin lens for a light emitting diode and, therefore, it is possible to assure uniformity of the finished products and to improve their quality and yield, exhibiting noticeable quality effects. Moreover, since the lead frames are arranged to be snugly fitted into the grooves of the molds 1, the lead frames will not be displaced when filling the mold 1 with the synthetic resin, and the operation may be done easily and efficiently.

In the case of the method in accordance with the present invention, the side edge portions of the free ends of the lead frames 3a, 3b are projected outwardly from the sides of the molded lens 7 (see FIG. 9) and thus, the heat emitting effect is superior to that encountered in prior art products in which the ends of the lead frames are completely embedded in the lens. These outwardly projecting portions are also quite useful as positioning guides for connection with a connector on the fiber side (not shown), when connecting a light fiber bundle or the like for optical communications and, further, since the light emitting element 4 is positioned on the center line of the finished product, alignment of the light emitting element with the optical axis of the light fiber bundle is easily accomplished.

The portion 3d' of the integral reinforcing strip 3d shown in dotted fashion is cut away as shown in FIG. 9 after the product is removed from the mold 1. The holder plate 3c is also completely removed prior to placing the finished product into use.

A latitude of modification, change and substitution is intended in the foregoing disclosure and in some instances, some features of the invention will be employed without a corresponding use of other features. Accordingly, it is appropriate that the appended claims be construed broadly and in a manner consistent with the spirit and scope of the invention herein.

What is claimed is:

1. A method for molding a synthetic resin lens for a light emitting diode, the method comprising the steps of:
providing a mold with a mold cavity having a bottom wall and a plurality of side walls defining a lens for the light emitting diode; forming a pair of grooves in the mold which are arranged on opposite sides of and communicate with the mold cavity, fitting the first ends of a pair of lead frames having a light emitting element mounted at a fixed position on one of said lead frames into said mold, so that a first portion of the first ends of each lead frame inserted into said mold extends into and is closely fitted within an associated one of said grooves, and so that the remaining portion of the first ends of each lead frame extends into said mold cavity, the first ends of said lead frames being inserted into the mold, so that the free ends thereof engage a bottom wall of the mold, and filling said mold with synthetic resin, the tight fit between said first portions of said lead frame and said grooves preventing the synthetic resin from entering into said grooves to completely expose the surfaces of the first portions when the molded product is removed from the mold.

2. Apparatus for molding a synthetic resin lens for a light emitting diode structure comprised of a pair of conductive lead frames joined by removable reinforcing means to maintain the lead frames in a predetermined spaced-apart arrangement; the free ends of said conductive lead frames having free end edges lying in a common imaginary plane and having opposing sides projecting away from one another; a mounting surface on one side of said lead frames extending toward the other lead frame and arranged a predetermined distance from the free end edge thereof; a light emitting element mounted upon said mounting surface to provide an electrical connection therebetween;
means for electrically connecting said light emitting element to the remaining one of said lead frames;
a mold having a mold cavity with a shape conforming to the lens to be molded and a pair of aligned recesses communicating with and on opposite sides of the cavity of said mold forming said lens, each receiving one of said opposing sides of said conductive lead frames;
said lead frames having at least the inner portions thereof arranged within said mold cavity;
at least a portion of the base of said mold cavity being arranged to engage said free edges and being flat to be engaged by both of said free edges to thereby precisely locate the light emitting element relative to the base of said mold cavity to assure precise positioning of the light emitting element relative to the surface of the lens formed by the base of said mold;
the grooves each forming a tight fit with the opposing surfaces of an associated lead frame to prevent the synthetic resin, used to fill the mold and form the lens, from entering said grooves, whereby the surfaces of said opposing sides are exposed and not covered by the synthetic resin when the molded lens is removed from the mold after being formed to provide for radiation of heat generated by said diode structure through the outer portions of said conductive lead frames.

3. The apparatus of claim 2 wherein the width of said recesses are substantially equal to the thickness of the opposing sides of said lead frames to keep the opposing sides of the lead frames received by said recesses free of synthetic resin poured into the mold, the opposing sides of said finished product extending sidewise from the molded lens serving as a heat radiating means.

4. The molding apparatus of claim 2 wherein the lead frames are provided with openings near the free ends thereof to receive resin and thereby strengthen the bonding of the resin to the lead frames.

5. The molding apparatus of claim 1 wherein the lead frames are provided with tapering portions adjacent said free edges to facilitate insertion of the lead frames onto the cooperating recesses.

* * * * *